United States Patent
Kao et al.

(10) Patent No.: US 9,281,221 B2
(45) Date of Patent: Mar. 8, 2016

(54) ULTRA-HIGH VACUUM (UHV) WAFER PROCESSING

(71) Applicant: Taiwan Semiconductor Manufacturing Company Limited, Hsin-Chu (TW)

(72) Inventors: Chung-En Kao, Miaoli County (TW); Tien-Chen Hu, New Taipei (TW); Mao-Lin Kao, Miaoli County (TW); Kuo-Fu Chien, Hsin-Chu (TW); Keith Koai, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 225 days.

(21) Appl. No.: 13/679,258

(22) Filed: Nov. 16, 2012

(65) Prior Publication Data

US 2014/0140792 A1 May 22, 2014

(51) Int. Cl.
*H01L 21/67* (2006.01)

(52) U.S. Cl.
CPC .... *H01L 21/67161* (2013.01); *H01L 21/67184* (2013.01); *H01L 21/67201* (2013.01)

(58) Field of Classification Search
CPC .................. H01L 21/67201; H01L 21/67742; H01L 21/67772; H01L 21/67745; H01L 21/67748
USPC ................................................ 414/217, 939
See application file for complete search history.

(56) References Cited

U.S. PATENT DOCUMENTS

| | | | |
|---|---|---|---|
| 7,658,586 B2* | 2/2010 | Niewmierzycki et al. ..... | 414/217 |
| 7,695,233 B2* | 4/2010 | Toshima ......................... | 414/217 |
| 2006/0045664 A1* | 3/2006 | Niewmierzycki et al. ..... | 414/217 |
| 2007/0107845 A1* | 5/2007 | Ishizawa et al. ......... | 156/345.32 |
| 2008/0101893 A1* | 5/2008 | Tanzawa ..................... | 414/217.1 |
| 2008/0138178 A1* | 6/2008 | Ferrara et al. .............. | 414/217.1 |
| 2010/0178135 A1* | 7/2010 | Laceky et al. ................ | 414/217 |
| 2011/0033636 A1* | 2/2011 | Nishimura et al. ........... | 427/557 |
| 2011/0229289 A1* | 9/2011 | Nogi et al. .................... | 414/217 |
| 2012/0170999 A1* | 7/2012 | Sakaue .......................... | 414/160 |
| 2013/0142595 A1* | 6/2013 | Shimomura et al. .......... | 414/217 |
| 2013/0309045 A1* | 11/2013 | Kobayashi .................... | 414/217 |

* cited by examiner

*Primary Examiner* — Kaitlin Joerger
(74) *Attorney, Agent, or Firm* — Cooper Legal Group, LLC

(57) ABSTRACT

One or more techniques or systems for ultra-high vacuum (UHV) wafer processing are provided herein. In some embodiments, a vacuum system includes one or more cluster tools connected via one or more bridges. For example, a first cluster tool is connected to a first bridge. Additionally, a second cluster tool is connected to a second bridge. In some embodiments, the first bridge is configured to connect the second cluster tool to the first cluster tool. In some embodiments, the second cluster tool is connected to the first bridge, thus forming a 'tunnel'. In some embodiments, the second bridge comprises one or more facets configured to enable a connection to an additional process chamber or an additional cluster tool. In this manner, a more efficient UHV environment is provided, thus enhancing a yield associated with wafer processing, for example.

20 Claims, 7 Drawing Sheets

ULTRA-HIGH VACUUM (UHV) WAFER PROCESSING

BACKGROUND

Generally, wafer processing, such as wafer processing during semiconductor fabrication, utilizes one or more process chambers. For example, a process chamber is associated with a target for wafer processing. However, as processes evolve, wafer processing becomes more challenging. For example, contaminants, such as dust, moisture, condensation, etc. often affect a wafer yield associated with the wafer processing.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques or systems for ultra-high vacuum (UHV) wafer processing are provided herein. Generally, wafer processing is associated with one or more process chambers, such as a process chamber of a cluster tool, for example. According to some aspects, an UHV environment is provided within a vacuum system or vacuum tunnel associated with wafer processing. For example, in some embodiments, a vacuum system is associated with one or more regions or one or more modules. In some embodiments, respective regions or respective modules are associated with different pressures. In some embodiments, a first region is associated with a first pressure and a second region is associated with a second pressure. For example, the second pressure of the second region is less than the first pressure of the first region. In some embodiments, the first region is associated with a first module, such as a remote load lock (RLL) module, and the second region is associated with a second module, such as a buffer module, for example. In some embodiments, the UHV environment of the vacuum system is configured to enable use of one or more cluster tools, thereby facilitating complex wafer processing, at least because additional cluster tools provide added process chambers for wafer processing, for example.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
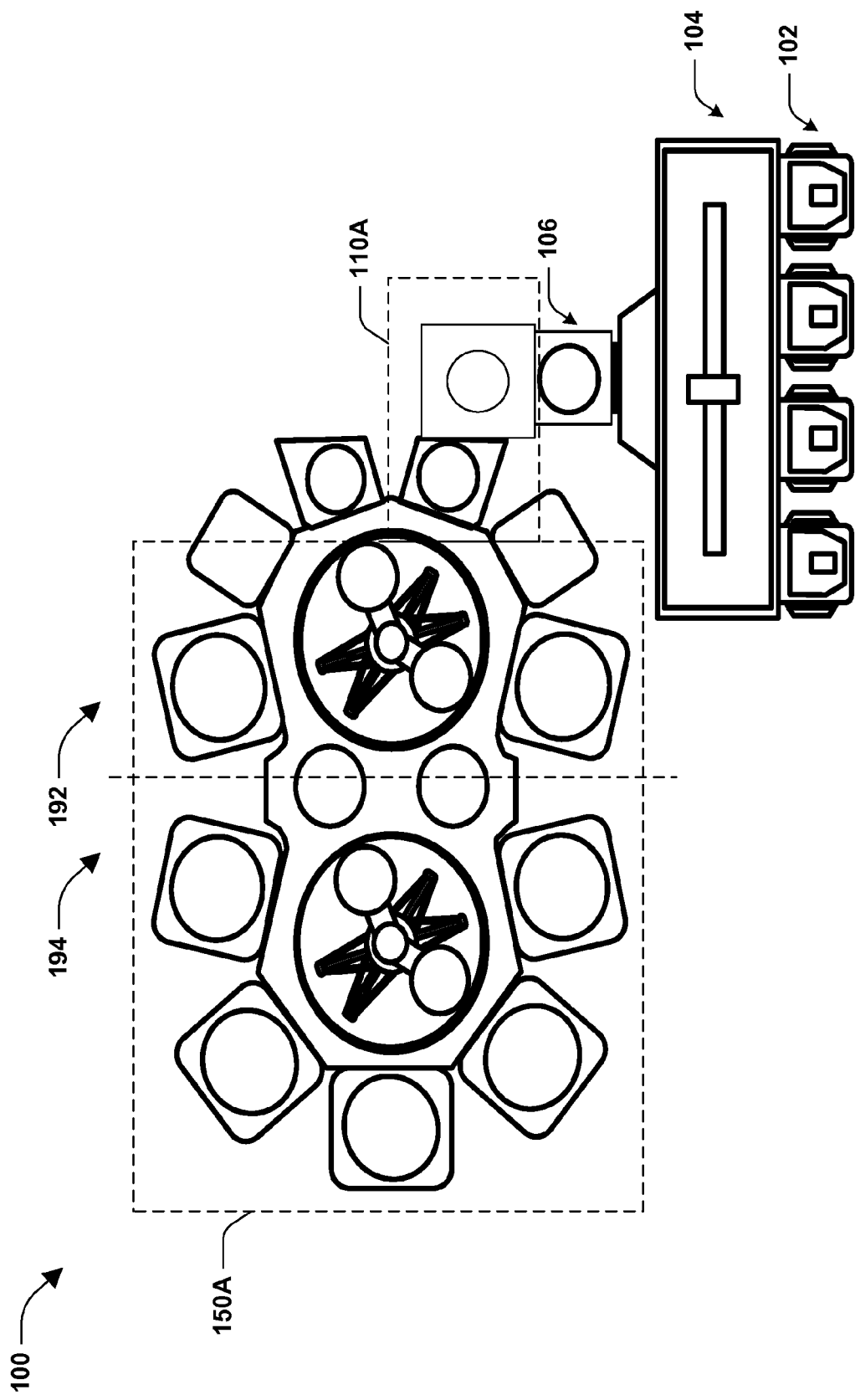
FIG. 1 is a schematic drawing of an example system for ultra-high vacuum (UHV) wafer processing, according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

It will be appreciated that for at least some of the figures herein, one or more boundaries, such as boundary 150A of FIG. 1, for example, are drawn with different heights, widths, perimeters, aspect ratios, etc. relative to one another merely for illustrative purposes, and are not necessarily drawn to scale. For example, because dashed or dotted lines are used to represent different boundaries, if the dashed and dotted lines were drawn on top of one another they would not be distinguishable in the figures, and thus are drawn slightly apart from one another, in at least some of the figures, such that they are distinguishable from one another, for example. As another example, because a component, such as a cluster tool, is associated with an irregular shape, a box associated with the component that is drawn with a dashed line, dotted lined, etc. does not necessarily encompass an entire component. Similarly, a drawn box associated with the component does not necessarily encompass merely the associated component, but encompasses at least some of one or more other components as well, in some embodiments. Accordingly, dimensions of at least some of these boundaries are drawn taller, shorter, wider, narrower, etc. than necessary in some embodiments such that the different boundaries are more visible in the figures for example.

FIG. 1 is a schematic drawing of an example system 100 for ultra-high vacuum (UHV) wafer processing, according to some embodiments. For example, the vacuum system 100 of FIG. 1 is associated with a first cluster tool 150A. In some embodiments, the first cluster tool 150A is connected to a remote load lock (RLL) module 106 via a first bridge 110A. In some embodiments, the RLL module is a stacked load lock module. It will be appreciated that the RLL module 106 is not adjacent to the first cluster tool 150A or a transfer module of the first cluster tool 150A. In this way, media, such as dust, moisture, condensation, contaminant, etc., is mitigated from interfering with the UHV environment of the vacuum system 100. Additionally, the system 100 of FIG. 1 comprises a robotic arm 104 and one or more load ports 102.

In some embodiments, one or more wafers are placed in a load port of the one or more load ports 102. In some embodiments, the robotic arm 104 transfers a wafer of the one or more wafers from a load port 102 to the remote load lock (RLL) module 106. In some embodiments, the RLL module 106 is configured to receive the wafer from the load port 102. Additionally, the RLL module 106 is configured to pump down the RLL module 106 to a first pressure. For example, the robotic arm 104 and the load ports 102 are generally associated with an atmospheric pressure, such as a standard atmosphere (1 atm). In some embodiments, the RLL module 106 pumps down a pressure within the RLL module 106 to a first pressure less than a standard atmosphere to facilitate an UHV environment for wafer processing. In some embodiments, the RLL module 106 is configured to pump the pressure of the RLL module 106 down to around $10^{-4}$ torr. In some embodiments, the wafer is transferred from the RLL module 106 to the first bridge 110A. For example, the first bridge 110A or a component of the first bridge 110A is configured to receive the wafer from the RLL module 106. In this way, the first bridge 110A is connected to the RLL module 106. In some embodiments, a second pressure is associated with the first bridge 110A. For example, the second pressure is less than the first pressure associated with the RLL module 106. In some embodiments, the first bridge 110A is configured to pump down at least one of the first bridge 110A or a component of the first bridge 110A to the second pressure. In some embodiments, at least one of the first cluster tool 150A or a component of the first cluster tool 150A is configured to receive the wafer from at least one of the first bridge 110A or a component of the first bridge 110A. In this way, the first cluster tool 150A is connected to the first bridge 110A.

In some embodiments, the first cluster tool 150A is configured to pump down the first cluster tool 150A to a third pressure. For example, the third pressure is less than the second pressure. In some embodiments, the first cluster tool 150A is configured to pump a first region 192 of the first cluster tool 150A down to the third pressure and a second region 194 of the first cluster tool 150A down to a fourth pressure, where the fourth pressure is less than the third pressure. It will be appreciated that a pressure associated with a cluster tool, such as the first cluster tool 150A is dynamic, and does not necessarily form distinct regions separated by a linear boundary, such as the dashed line between the first region 192 and the second region 194. Accordingly, the first region 192 and the second region 194 are depicted merely as example regions, according to some embodiments. In this way, an UHV environment is created for the vacuum system 100 to facilitate wafer processing, at least because three or more pressures are associated with the vacuum system 100 of FIG. 1. For example, since the second pressure is less than the first pressure, and the third pressure is less than the second pressure of the vacuum system 100, a wafer is exposed to lower pressures as processing occurs. Therefore, the exposure to a subsequent pressure lower than a previous pressure mitigates media, such as moisture, condensation, dust, contaminants, etc. from interfering with wafer processing. In this way, a process path associated with wafer fabrication is formed so a wafer 'tunnels' from one pressure to another lower pressure.

It will be appreciated that in some embodiments, any number of components, modules, regions, areas, etc. are connected in series, and pumped down to different pressures. In some embodiments, the connections form a 'loop' such that a wafer passes through a module, component, etc. more than once, for example. In some embodiments, a wafer enters a first buffer module to undergo processing in the first cluster tool 150A and returns via the first buffer module to the RLL module 106.

Figure 2:
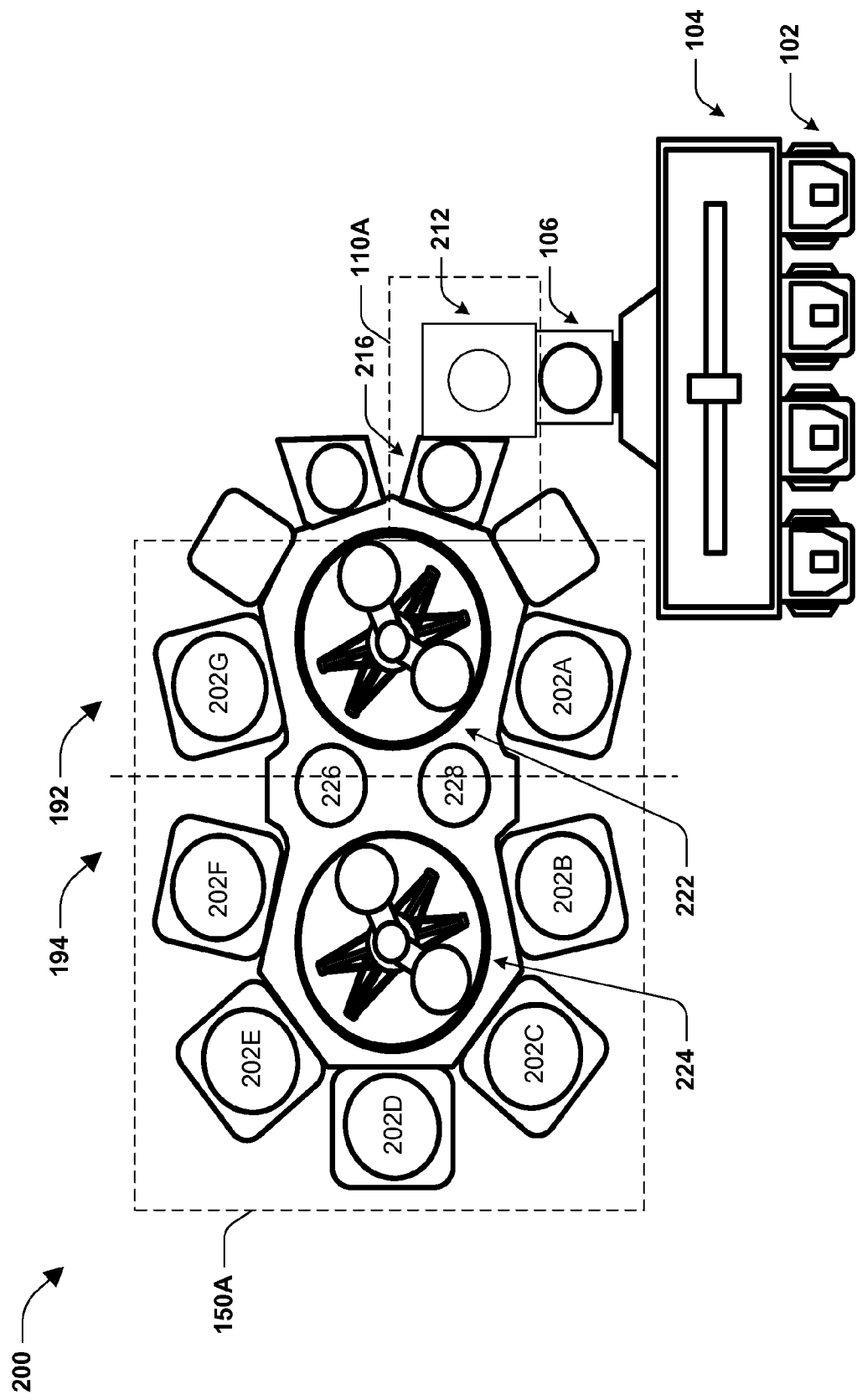
FIG. 2 is a schematic drawing of an example system for ultra-high vacuum (UHV) wafer processing, according to some embodiments.

FIG. 2 is a schematic drawing of an example system 200 for ultra-high vacuum (UHV) wafer processing, according to some embodiments. For example, the vacuum system 200 of FIG. 2 comprises one or more load ports 102, a robotic arm 104, a remote load lock (RLL) module 106, a first buffer module 212, and a first bypass module 216. In some embodiments, the vacuum system 200 is connected to a first cluster tool 150A. In some embodiments, the vacuum system 200 comprises the first cluster tool 150A. In some embodiments, a load port 102 is connected to the robotic arm 104. In some embodiments, the robotic arm 104 is connected to the RLL module 106. In some embodiments, the RLL module 106 is connected to the first buffer module 212. Additionally, the first buffer module 212 is connected to the first bypass module 216. In some embodiments, the first bypass module 216 is connected to the first cluster tool 150A. In some embodiments, the RLL module 106 is connected to a first bridge 110A. Additionally, the first bridge 110A is connected to the first cluster tool 150A. For example, the first bridge 110A is connected to the first cluster tool 150A via the first bypass module 216 and the first transfer module 222. In this way, the first bypass module 216 links or connects the first buffer module 212 and the first transfer module 222. It will be appreciated that components, modules, tools, robotic arms, etc. are connected in a manner such that respective components, etc. are configured to at least one of transfer or receive wafer from one another. For example, the first buffer module 212 is configured to at least one of receive a wafer from the RLL module 106 or receive a wafer from the first bypass module 216.

In some embodiments, a first bridge 110A comprises the first buffer module 212 and the first bypass module 216. In other embodiments, the first bridge 110A comprises additional modules, for example. In some embodiments, the first cluster tool 150A comprises at least one of one or more transfer modules, one or more via channels, one or more degas chambers, or one or more process chambers. In some embodiments, the first cluster tool 150A is configured to receive the wafer from the first bypass module 216. For example, the first cluster tool 150A of FIG. 2 comprises a first transfer module 222 and a second transfer module 224. Additionally, the first cluster tool 150A comprises a first via channel 226 and a second via channel 228. Additionally, the first cluster tool 150A comprises a first process chamber 202A, a second process chamber 202B, a third process chamber 202C, a fourth process chamber 202D, a fifth process chamber 202E, a sixth process chamber 202F, and a seventh process chamber 202G. In some embodiments, respective process chambers are associated with respective targets. Accordingly, complex wafer fabrication associated with multiple targets or process chambers is enabled by linking or connecting one or more cluster tools based on one or more bridges, such as the first bridge 110A.

In some embodiments, a wafer of one or more wafers is received from a load port 102 by the robotic arm at 104. According to some examples, the load port 102 and the robotic arm 104 are associated with a standard atmosphere of 1 atm. For example, the robotic arm 104 is configured to transfer the wafer from the load port 102 to the remote load lock (RLL) module 106 and vice versa. In some embodiments, the RLL module 106 is adjacent to the robotic arm 104 and configured to receive the wafer from the robotic arm 104. In some embodiments, the RLL module 106 comprises at least one of a gate valve or a slit valve situated at an interface between the RLL module 106 and the robotic arm 104. For example, at least one of the gate valve or the slit valve enables the RLL module 106 to pump the RLL module 106 down to a first pressure. In some embodiments, at least one of the gate valve or the slit valve is configured to control a pressure difference between the RLL module 106 and the robotic arm 104. For example, at least one of the gate valve or the slit valve is configured to control a pressure associated with the RLL module 106 based on an interface between the RLL module 106 and the load port 102 or an interface between the RLL module 106 and the robotic arm 104. For example, the first pressure is a pressure less than a standard atmosphere, such as 1 atm. In some embodiments, the first pressure is around $10^{-4}$ torr. Additionally, the RLL module 106 comprises one or more isolation valves. In some embodiments, at least some of the isolation valves are configured to control media flow at least one of to the RLL module 106 or from the RLL module 106 to another module or component, for example. In other words, at least some of the isolation valves are configured to control media flow associated with the RLL module 106. As used herein, 'media' contemplates gases, such as air, contaminants, such as dust, moisture, condensation, or other particles, etc. Accordingly, media flow is the flow of media from one module or component to another module or component, for example. In this way, the RLL module 106 is configured to control media, such as contaminants or moisture, in a manner that mitigates media from interfering with the UHV environment of the vacuum system 200, at least because the RLL module 106 is not adjacent to or connected to at least one of the first cluster tool 150A or the first transfer module 222 of the first cluster tool 150A. Accordingly, a yield associated with wafer processing of the vacuum system 200 is improved, at least due to a reduction in cross contamination based on a location of the RLL module 106, for example.

In some embodiments, the RLL module 106 is connected to a first bridge 110A. For example, the first bridge 110A comprises the first buffer module 212 and the first bypass module 216. In some embodiments, the RLL module 106 is connected to a first buffer module 212. For example, the first buffer module 212 is configured to receive the wafer from the RLL module 106. In some embodiments, the first buffer module 212 comprises a robotic arm configured to transfer the wafer from the RLL module 106 to the first buffer module 212. In some embodiments, the robotic arm of the first buffer module 212 is configured to transfer the wafer from the first buffer module to the RLL module 106. Additionally, the robotic arm of the first buffer module 212 is configured to transfer the wafer from the first buffer module 212 to the first bypass module 216 or vice versa. It will be appreciated that the first buffer module 212 is located between the RLL module 106 and the first bypass module 216. In some embodiments, the first buffer module 212 is located adjacent to at least one of the RLL module 106 or the first bypass module 216. Accordingly, the first buffer module 212 is configured to connect the RLL module 106 to the first bypass module 216. In some embodiments, the first buffer module 212 is configured to pump down the first buffer module 212 to a second pressure. For example, the second pressure is less than the first pressure. In this way, a wafer is exposed to a first pressure at the RLL module 106 and a second pressure at the first buffer module 212 such that the second pressure is lower than the first pressure. Accordingly, since the RLL module 106 is before the first buffer module 212 during wafer processing, a wafer is exposed to the second lower pressure subsequent to the first pressure, for example. In this way, media, such as dust, contaminants, moisture, etc. is mitigated in the UHV environment of the vacuum system 200, at least because the second pressure is less than the first pressure. Accordingly, it will be appreciated that in some embodiments, the wafer is exposed to lower and lower pressures as wafer processing progresses. In some embodiments, the first buffer module 212 comprises one or more facets. For example, a facet of the one or more facets is configured to connect the first buffer module 212 to at least one of an additional process chamber or an additional cluster tool.

In some embodiments, the first buffer module 212 comprises one or more isolation valves. In some embodiments, at least some of the isolation valves are configured to control media flow at least one of to the first buffer module 212 or from the first buffer module 212 to another module or component, for example. In other words, at least some of the isolation valves are configured to control media flow associated with the first buffer module 212. In some embodiments, the first bypass module 216 is connected to the first buffer module 212 and is configured to receive the wafer from the first buffer module 212. In some embodiments, the first bypass module 216 comprises an alignment unit configured to align an orientation of the wafer. Additionally, in some embodiments, the first bypass module 216 comprises one or more isolation valves. In some embodiments, at least some of the isolation valves are configured to control media flow at least one of to the first bypass module 216 or from the first bypass module 216 to another module or component, for example. In other words, at least some of the isolation valves are configured to control media flow associated with the first bypass module.

In some embodiments, the first transfer module 222 is configured to receive the wafer from the first bypass module 216. For example, the first bypass module 216 is configured to connect the first buffer module 212 to the first transfer module 222. In some embodiments, the first transfer module 222 comprises a robotic arm. For example, the robotic arm of the first transfer module 222 is configured to transfer a wafer from the first bypass module 216 to the first transfer module 222 and vice versa. In some embodiments, the first transfer module 222 is configured to transfer the wafer from the first transfer module 222 to at least one of one or more process chambers, one or more via channels, or one or more degas chambers and vice versa. For example, the first transfer module 222 is configured to transfer the wafer to or from at least one of the first via channel 226, the second via channel 228, the first process chamber 202A, the seventh process chamber 202G, or a degas chamber. Similarly, the second transfer module 224 is configured to transfer the wafer to or from at least one of the first via channel 226, the second via channel 228, the second process chamber 202B, the third process chamber 202C, the fourth process chamber 202D, the fifth process chamber 202E, or the sixth process chamber 202F. In some embodiments, the first cluster tool 150A is configured to pump down a pressure associated with the first cluster tool 150A to a third pressure. For example, the third pressure is less than the second pressure. Additionally, the first cluster tool 150A is configured to pump down at least a portion of the first cluster tool 150A to a fourth pressure in some embodiments. For example, the fourth pressure is less than the third pressure. In some embodiments, the first cluster tool 150A is configured to pump down a first region 192 of the first cluster tool 150A down to the third pressure and a second region 194 of the first cluster tool 150A down to the fourth pressure. For example, in some embodiments, the first region 192 is associated with the first transfer module 222 and the second region 194 is associated with the second transfer module 224. However, it will be appreciated that a pressure associated with a cluster tool, such as the first cluster tool 150A of FIG. 2 is generally dynamic. Accordingly, the pressure of the first cluster tool 150A is associated with a gradient, and does not necessarily form readily distinguishable regions, for example.

In some embodiments, a cluster tool or a vacuum system, such as the vacuum system 200 of FIG. 2 is configured such that a wafer is exposed to a first pressure at the RLL module 106, a second pressure at the first buffer module 212, a third pressure at the first region 192 of the first cluster tool 150A, and a fourth pressure at a second region 194 of the first cluster tool 150A. In some embodiments, a wafer being processed is placed in the RLL module 106 at a first time, the first buffer module 212 at a second time, the first region 192 of the first cluster tool 150A at a third time, the second region 194 of the first cluster tool 150A at a fourth time, etc. For example, the second time is after the first time, the third time is after the second time, and the fourth time is after the third time. Accordingly, it will be appreciated that the wafer is exposed to subsequently lower pressures as wafer processing continues. For example, the fourth pressure is less than the third pressure, the third pressure is less than the second pressure, the second pressure is less than the first pressure, etc. In this way, media, such as dust, contaminants, moisture, etc. is mitigated, at least because lower pressures are associated with less interference from media, and thus, a higher wafer yield, for example.

FIG. 3-FIG. 6 are examples of various embodiments of systems for ultra-high vacuum (UHV) wafer processing. It will be appreciated that at least some of the components, modules, robotic arms, etc. of such systems operate in a similar fashion as described in at least one of FIG. 1 or FIG. 2. Additionally, it will be appreciated that at least some of the components, modules, robotic arms, etc. of such systems comprise components similar to those described in at least one of FIG. 1 or FIG. 2. For example, a bridge generally comprises a first bypass module connected to a buffer module connected to a second bypass module. Additionally, a cluster tool generally comprises one or more transfer modules, one or more via channels, one or more process chambers, or one or more degas chambers. However, it will be appreciated that a bridge or cluster tool comprises additional modules or components in some embodiments. Additionally, transfer modules are configured to receive a wafer from an adjacent or a connected bypass module, for example.

Figure 3:
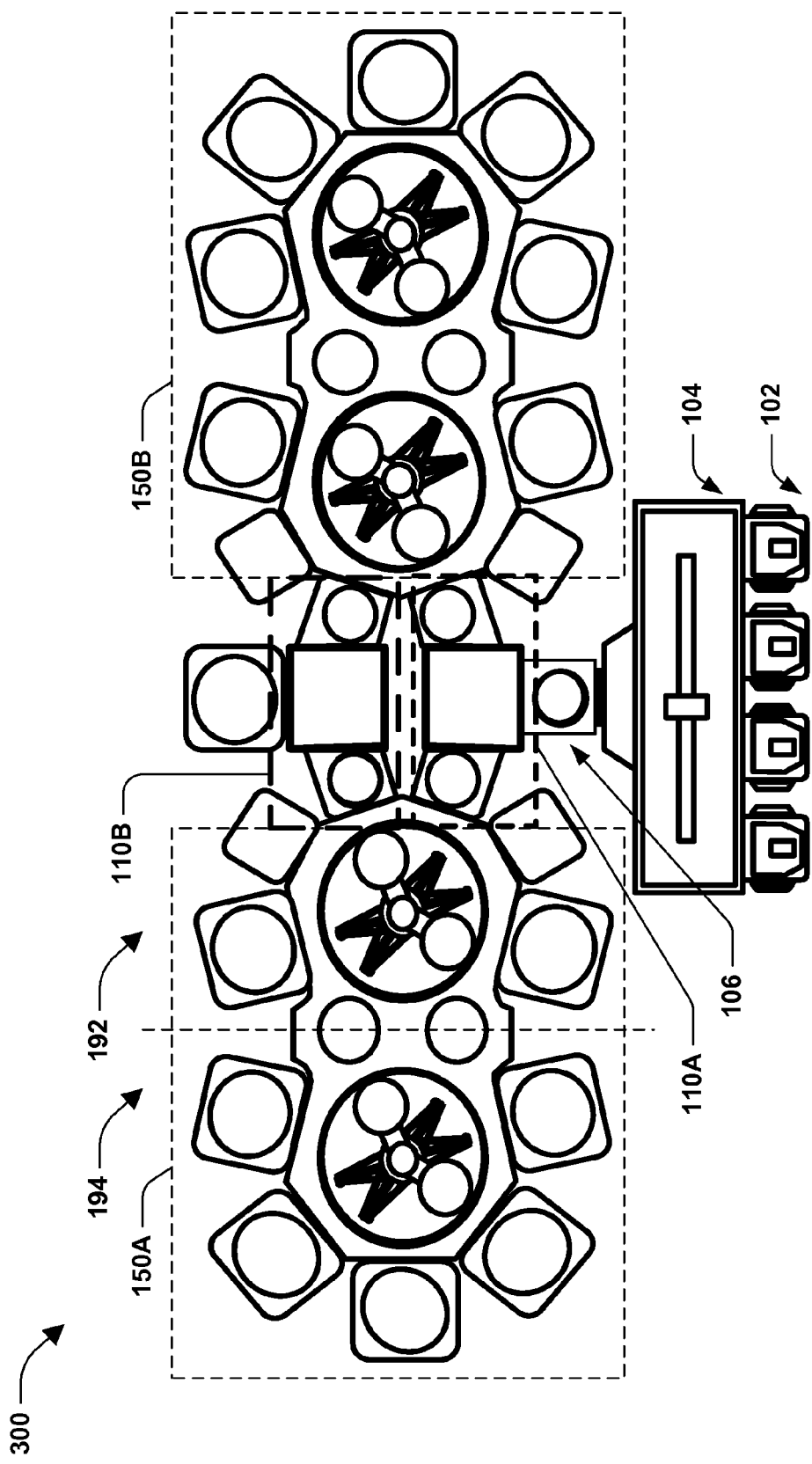
FIG. 3 is a schematic drawing of an example system for ultra-high vacuum (UHV) wafer processing, according to some embodiments.

FIG. 3 is a schematic drawing of an example system 300 for ultra-high vacuum (UHV) wafer processing, according to some embodiments. For example, the vacuum system 300 of FIG. 3 comprises a remote load lock (RLL) module 106, a first bridge 110A, and a second bridge 110B. In some embodiments, the RLL module 106 is connected to a robotic arm 104. In some embodiments, the robotic arm 104 receives wafers from one or more load ports 102. In some embodiments, the RLL module 106 is connected to the first bridge 110A. In some embodiments, the first bridge 110A is connected to a first cluster tool 150A. Additionally, the first cluster tool 150A is connected to a second bridge 110B. In some embodiments, the second bridge 110B is connected to a second cluster tool 150B. The second cluster tool 150B is connected to the first bridge 110A to form a 'tunnel', according to some embodiments. In some embodiments, the RLL module 106 is configured to pump down a pressure associated with the RLL module 106 to a first pressure less than a standard atmosphere. In some embodiments, at least one of the first bridge 110A or the second bridge 110B is configured to pump down the first bridge 110A or the second bridge 110B to a second pressure, respectively. For example, the second pressure is less than the first pressure. In some embodiments, the second bridge 110B is configured to pump down a pressure associated with the second bridge 110B down to a pressure lower than the first pressure. In some embodiments, the first cluster tool 150A is configured to pump down a pressure associated with the first cluster tool 150A down to a third pressure. For example, the third pressure is less than the second pressure. In some embodiments, the first cluster tool 150A is associated with one or more regions. For example, the first cluster tool 150A of FIG. 3 is associated with a first region 192 and a second region 194. However, in other embodiments, the first cluster tool 150A is associated with more regions, for example. In some embodiments, the first region 192 is associated with the third pressure. In some embodiments, the first cluster tool 150A is configured to pump down the second region 194 to a fourth pressure. For example, the fourth pressure is less than the third pressure. In some embodiments, the second cluster tool 150B is configured to pump down the second cluster tool 150B to at least one of the third pressure or the fourth pressure. Accordingly, a wafer progresses from the load port 102 to the robotic arm 104, to the RLL module 106, to the first bridge 110A, to the first cluster tool 150A for at least some wafer processing, to the second bridge 110B, to the second cluster tool 150B for at least some additional wafer processing, and to the first bridge 110A. In this manner, wafer processing is expanded based on the second bridge 110B, at least because the second bridge 110B enables one or more additional cluster tools, such as the second cluster tool 150B, to be included in UHV wafer processing. Additionally, a cleaner UHV environment is provided, at least because a pressure associated with the second cluster tool 150B is lower than a pressure associated with the first cluster tool 150A. Therefore, a pressure associated with the later stages of wafer processing is lower than a pressure associated with earlier stages of wafer processing, at least because the first cluster tool 150A is associated with at least some of the earlier stages of wafer processing and the second cluster tool 150B is associated with at least some of the later stages of wafer processing. It will be appreciated that in other embodiments, the second cluster tool 150B is associated with at least some of the earlier states of processing and the first cluster tool 150A is associated with at least some of the later stages of processing. In such embodiments, it will be appreciated that the first cluster tool 150B is pumped down to a pressure lower than a pressure of the second cluster tool 150A, for example.

It will be appreciated that in some embodiments, a bridge is configured to connect at least one of the RLL module 106 to a cluster tool, the RLL module 106 to a transfer module of a cluster tool, a first cluster tool 150A to a second cluster tool 150B, or one cluster tool to another cluster tool. In some embodiments, a bridge, such as the second bridge 110B comprises one or more facets. For example, a facet of the one or more facets is configured to connect the bridge to at least one of an additional process chamber or an additional cluster tool, as will be described in further detail in FIG. 6.

Figure 4:
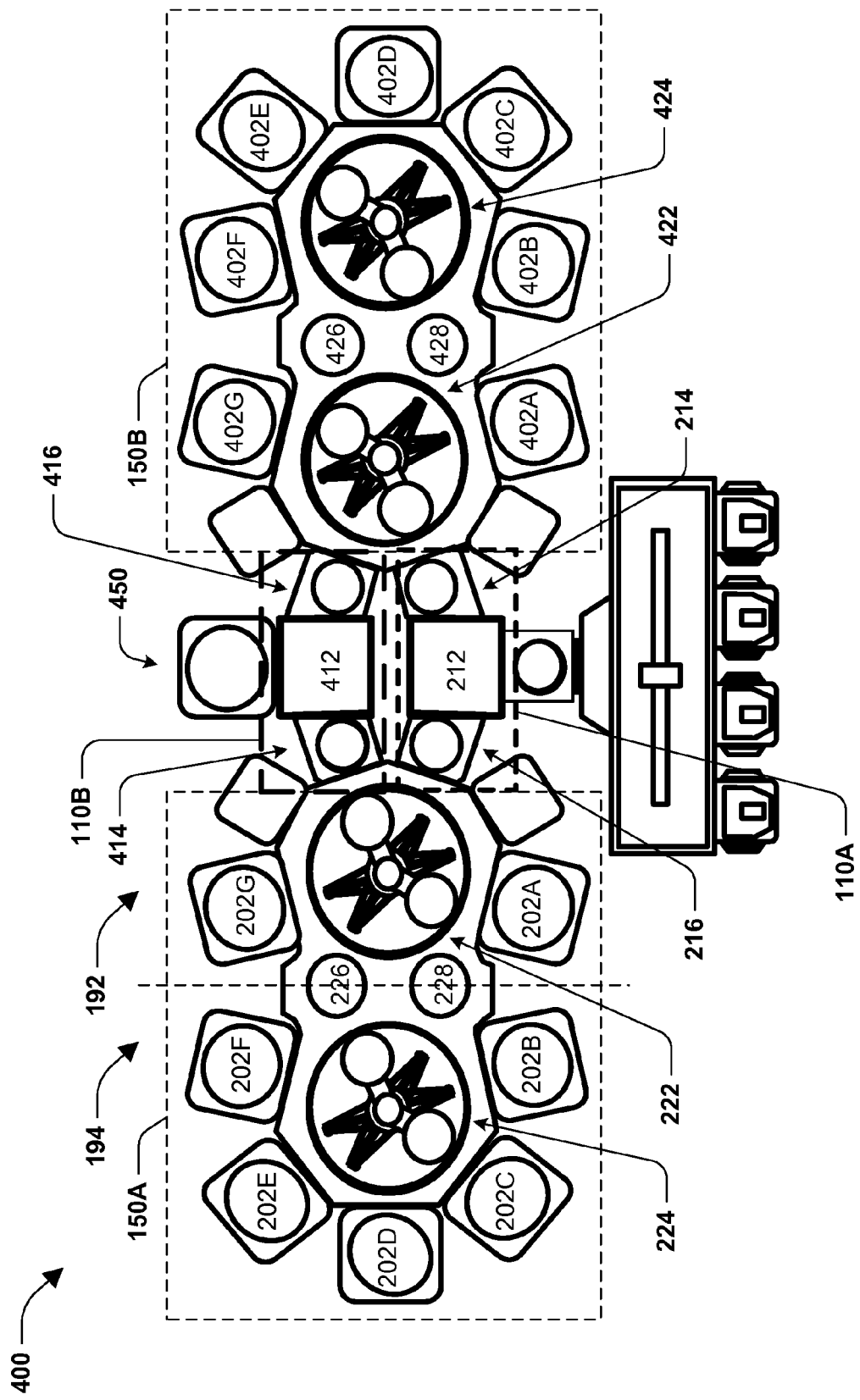
FIG. 4 is a schematic drawing of an example system for ultra-high vacuum (UHV) wafer processing, according to some embodiments.

FIG. 4 is a schematic drawing of an example system 400 for ultra-high vacuum (UHV) wafer processing, according to some embodiments. It will be appreciated that the vacuum system 400 of FIG. 4 is similar to the vacuum system 200 of FIG. 2, except that the vacuum system of FIG. 4 comprises a first bridge 110A and a second bridge 110B. Additionally, the first bridge 110A comprises a second bypass module 214. In some embodiments, the first bridge 110A comprises a first buffer module 212 between a first bypass module 216 and a second bypass module 214. In some embodiments, the second bridge 110B comprises a second buffer module 412 between a third bypass module 416 and a fourth bypass module 414. In some embodiments, the vacuum system 400 of FIG. 4 is connected to one or more cluster tools. For example, the first bridge 110A is configured to connect a first cluster tool 150A to a second cluster tool 150B. Similarly, the second bridge 110B is configured to connect the first cluster tool 150A to the second cluster tool 150B. In this manner, a wafer processing 'tunnel' is formed based on a bridge connecting two or more cluster tools. In some embodiments, at least one of the first cluster tool 150A or the second cluster tool 150B comprises one or more transfer modules, one or more via channels, one or more process chambers, and one or more degas chambers. For example, the first cluster tool 150A comprises a first transfer module 222, a second transfer module 224, a first via channel 226, a second via channel 228, a first process chamber 202A, a second process chamber 202B, a third process chamber 202C, a fourth process chamber 202D, a fifth process chamber 202E, a sixth process chamber 202F, and a seventh process chamber 202G. Similarly, the second cluster tool 150B comprises a first transfer module 422, a second transfer module 424, a first via channel 426, a second via channel 428, a first process chamber 402A, a second process chamber 402B, a third process chamber 402C, a fourth process chamber 402D, a fifth process chamber 402E, a sixth process chamber 402F, and a seventh process chamber 402G.

In some embodiments, a remote load lock (RLL) module is connected to at least one of the first bridge 110A or the first buffer module 212 of the first bridge 110A. In some embodiments, the first buffer module 212 is connected to the first bypass module 216 of the first bridge 110A. In some embodiments, the first bridge 110A is connected to the first cluster tool 150A. For example, the first bypass module 216 of the first bridge 110A is connected to the first transfer module 222 of the first cluster tool 150A. In some embodiments, the first cluster tool 150A is connected to the second bridge 110B. For example, the first transfer module 222 of the first cluster tool 150A is connected to the fourth bypass module 414 of the second bridge 110B. In some embodiments, the second bridge 110B is connected to the second cluster tool 150B. For example, the third bypass module 416 of the second bridge 110B is connected to the first transfer module 422 of the second cluster tool 150B. In some embodiments, the second cluster tool 150B is connected to the first bridge 110A to form a 'tunnel' by completing a loop from the first bridge 110A to the first cluster tool 150A, to the second bridge 110B, to the second cluster tool 150B, back to the first bridge 110A. For example, the first transfer module 422 of the second cluster tool 150B is connected to the second bypass module 214 of the first bridge 110A.

In some embodiments, the RLL module is connected to the first buffer module 212 of the first bridge 110A, connected to the first bypass module 216 of the first bridge 110A, connected to the first transfer module 222 of the first cluster tool 150A, connected to the fourth bypass module 414 of the second bridge 110B, connected to the second buffer module 412 of the second bridge 110B, connected to the third bypass module 416 of the second bridge 110B, connected to the first transfer module 422 of the second cluster tool 150B, connected to the second bypass module 214 of the first bridge 110A. Accordingly, respective modules, components, tools, etc. are configured to receive wafers from adjacent or connected modules, components, tools, etc. In some embodiments, the RLL module is configured to pump down the RLL module to a first pressure. In some embodiments, at least one of the first bridge 110A or the first buffer module 212 is configured to pump down at least one of the first bridge 110A or the first buffer module 212 down to a second pressure. For example, the second pressure is less than the first pressure. In some embodiments, the first cluster tool 150A is configured to pump down the first cluster tool 150A to a third pressure. For example, the third pressure is less than the second pressure. In some embodiments, the first cluster tool 150A is configured to pump down at least a portion of the first cluster tool 150A to a fourth pressure. For example, the fourth pressure is less than the third pressure. In some embodiments, the first cluster tool is configured to pump down a first region 192 of the first cluster tool 150A to the third pressure and a second region 194 of the first cluster tool 150A down to the fourth pressure. In some embodiments, the second bridge 110B is associated with at least one of the second pressure, the third pressure, or the fourth pressure. For example, at least one of the second bridge 110B or the second buffer module 412 is configured to pump down at least one of the second bridge 110B or the second buffer module 412 down to at least one of the second pressure, the third pressure, or the fourth pressure. In some embodiments, the second cluster tool 150B is configured to pump down the second cluster tool 150B to at least one of the third pressure or the fourth pressure. In other words, the second cluster tool 150B is associated with at least one of the third pressure or the fourth pressure. In this way, the second bridge 110B enables the second cluster tool 150B to maintain a lower pressure, such as the fourth pressure, at least because the second bridge 110B is configured to connect the first cluster tool 150A and the second cluster tool 150B based on a 'tunnel' configuration. For example, the RLL module is associated with the first pressure, the first bridge 110A is associated with the second pressure, and the first cluster tool 150A is associated with at least one of the third pressure or the fourth pressure. In some embodiments, the second bridge 110B facilitates maintaining at least one of the third pressure or the fourth pressure by connecting the first cluster tool 150A to the second cluster tool 150B. Accordingly, the second cluster tool 150B is associated with at least one of the third pressure or the fourth pressure, for example. In this way, a bridge, such as the second bridge 110B is configured to connect one cluster tool to another cluster tool. Since a cluster tool is associated with one or more process chambers, such as process chambers 402A-402G, complex processes associated with a number of process chambers are thus enabled in an UHV environment. In some embodiments, the second bridge 110B comprises a facet enabling the second bridge 110B to be connected to an additional process chamber 450. In some embodiments, the second buffer module 412 comprises a facet enabling the second buffer module 412 to be connected to the additional process chamber 450.

Figure 5:
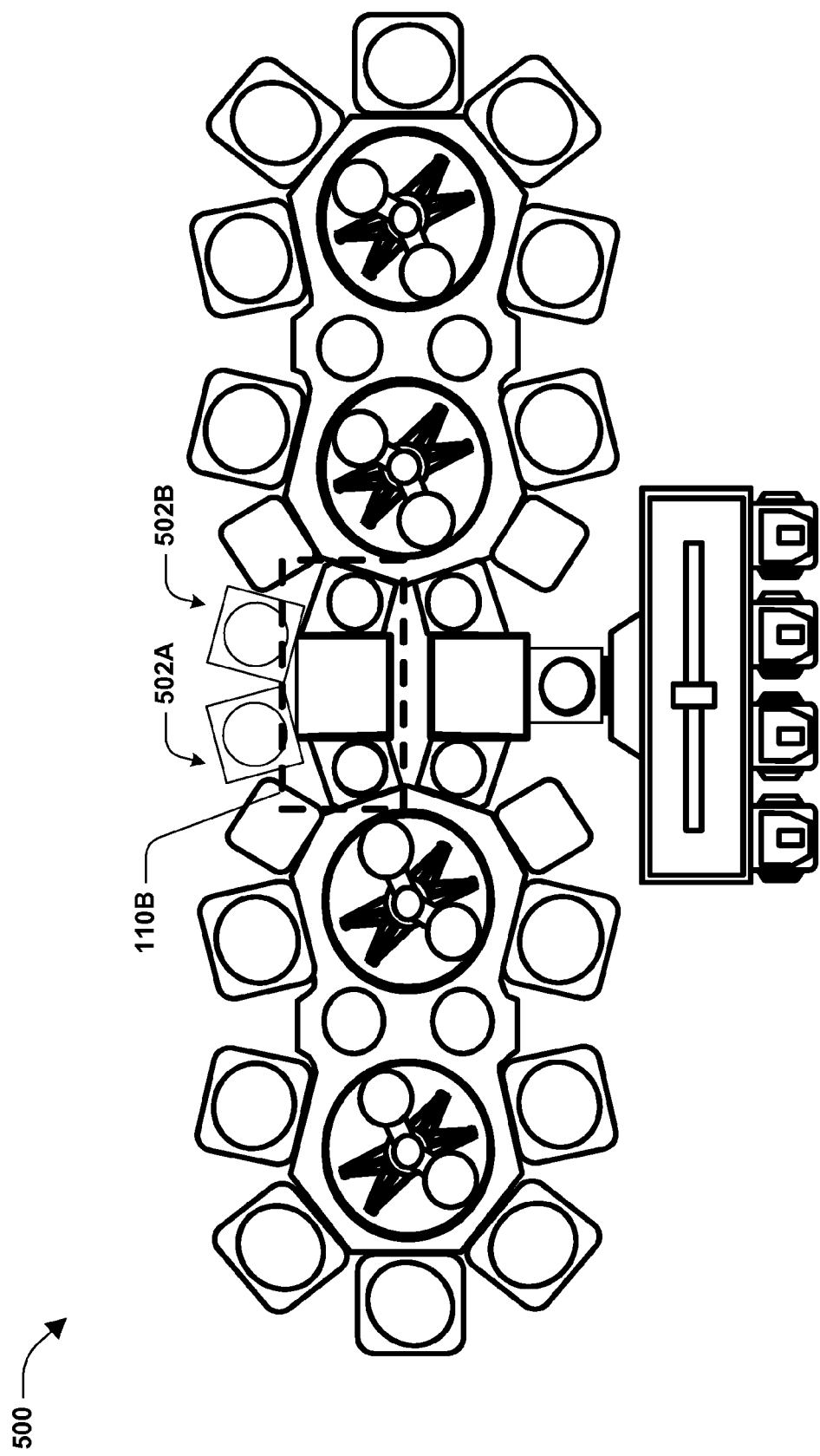
FIG. 5 is a schematic drawing of an example system for ultra-high vacuum (UHV) wafer processing, according to some embodiments.

FIG. 5 is a schematic drawing of an example system 500 for ultra-high vacuum (UHV) wafer processing, according to some embodiments. In some embodiments, a bridge, such as a second bridge 110B of FIG. 5, comprises one or more facets. For example, a facet of the one or more facets is configured to connect the second bridge 110B to one or more additional process chambers. In FIG. 5, the second bridge 110B is configured with a first facet for a first additional process chamber 502A and a second facet for a second additional process chamber 502B. In some embodiments, a buffer module, such as a second buffer module for the second bridge 110B of FIG. 5, comprises one or more facets. For example, a facet of the one or more facets is configured to connect the second buffer module of the second bridge 110B to one or more additional process chambers. Accordingly, in FIG. 5, the second buffer module of the second bridge 110B is configured with the first facet and the second facet, thus enabling connection to a first additional process chamber 502A and a second additional process chamber 502B.

Figure 6:
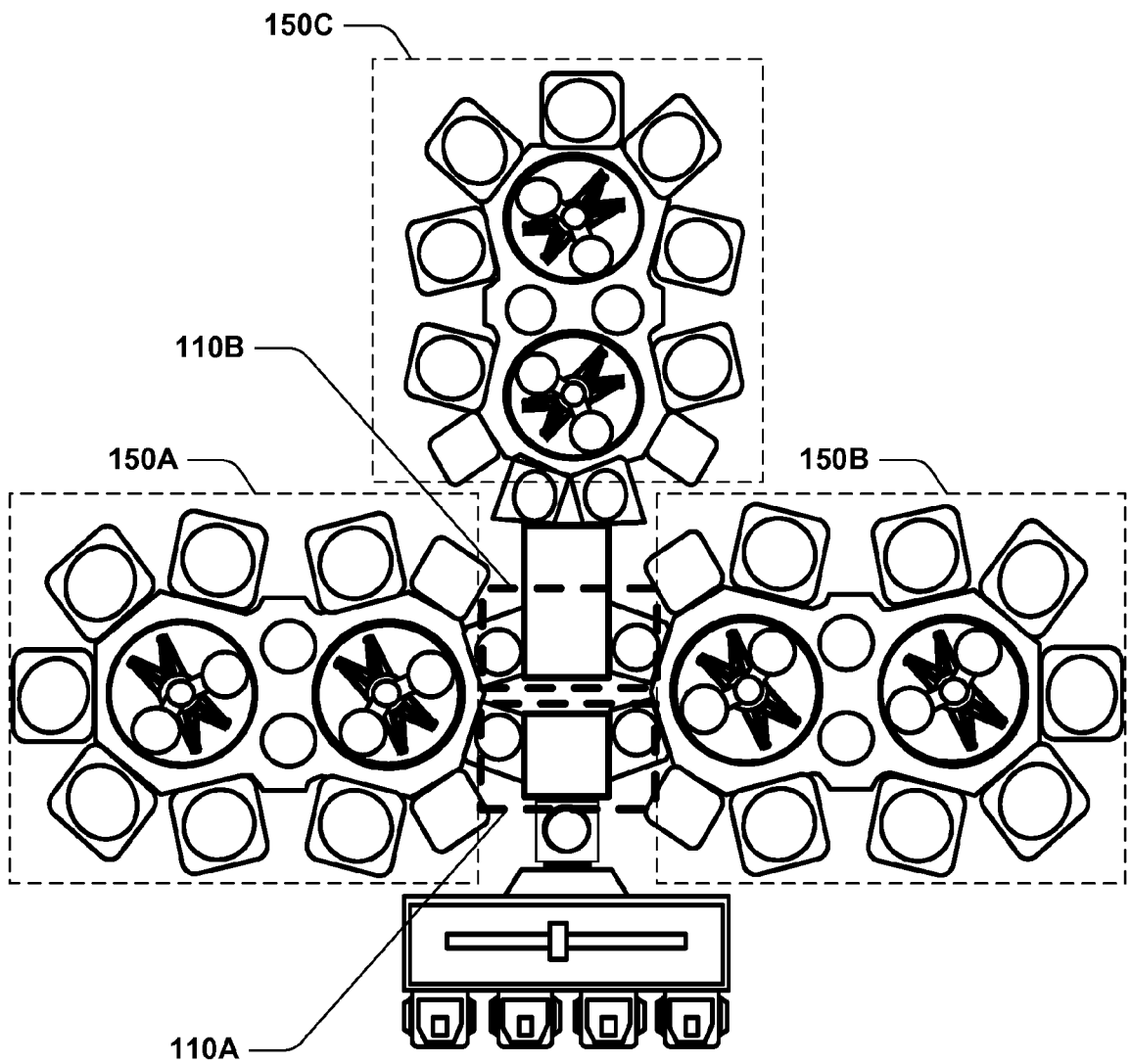
FIG. 6 is a schematic drawing of an example system for ultra-high vacuum (UHV) wafer processing, according to some embodiments.

FIG. 6 is a schematic drawing of an example system 600 for ultra-high vacuum (UHV) wafer processing, according to some embodiments. In some embodiments, a first bridge 110A of FIG. 6 is configured to connect a remote load lock (RLL) module to at least one of a first cluster tool 150A or a second cluster tool 150B. Additionally, the first bridge 110A is configured to connect the first cluster tool 150A to the second cluster tool 150B. In some embodiments, a second bridge 110B is configured to connect the first cluster tool to the second cluster tool, such as via a third bypass module and a fourth bypass module. It will be appreciated that the second bridge 110B is configured to connect a third cluster tool 150C to at least one of the first cluster tool 150A or the second cluster tool 150B. In this way, the vacuum system 600 of FIG. 6 is configured to enable multi-cluster tool wafer processing, at least because the second bridge 110B is configured to connect the first cluster tool 150A, the second cluster tool 150B, and the third cluster tool 150C. In other embodiments, the first bridge 110A is connected to the first cluster tool 150A, the first cluster tool 150A is connected to the second bridge 110B, the second bridge 110B is connected to the second cluster tool 150B, the second cluster tool 150B is connected to a third bridge (not shown), the third bridge is connected to the third cluster tool 150C, and the third cluster tool 150C. Additionally, in some embodiments, the third cluster tool 150C is connected to the first bridge 110A to form a 'tunnel' for wafer processing.

Figure 7:
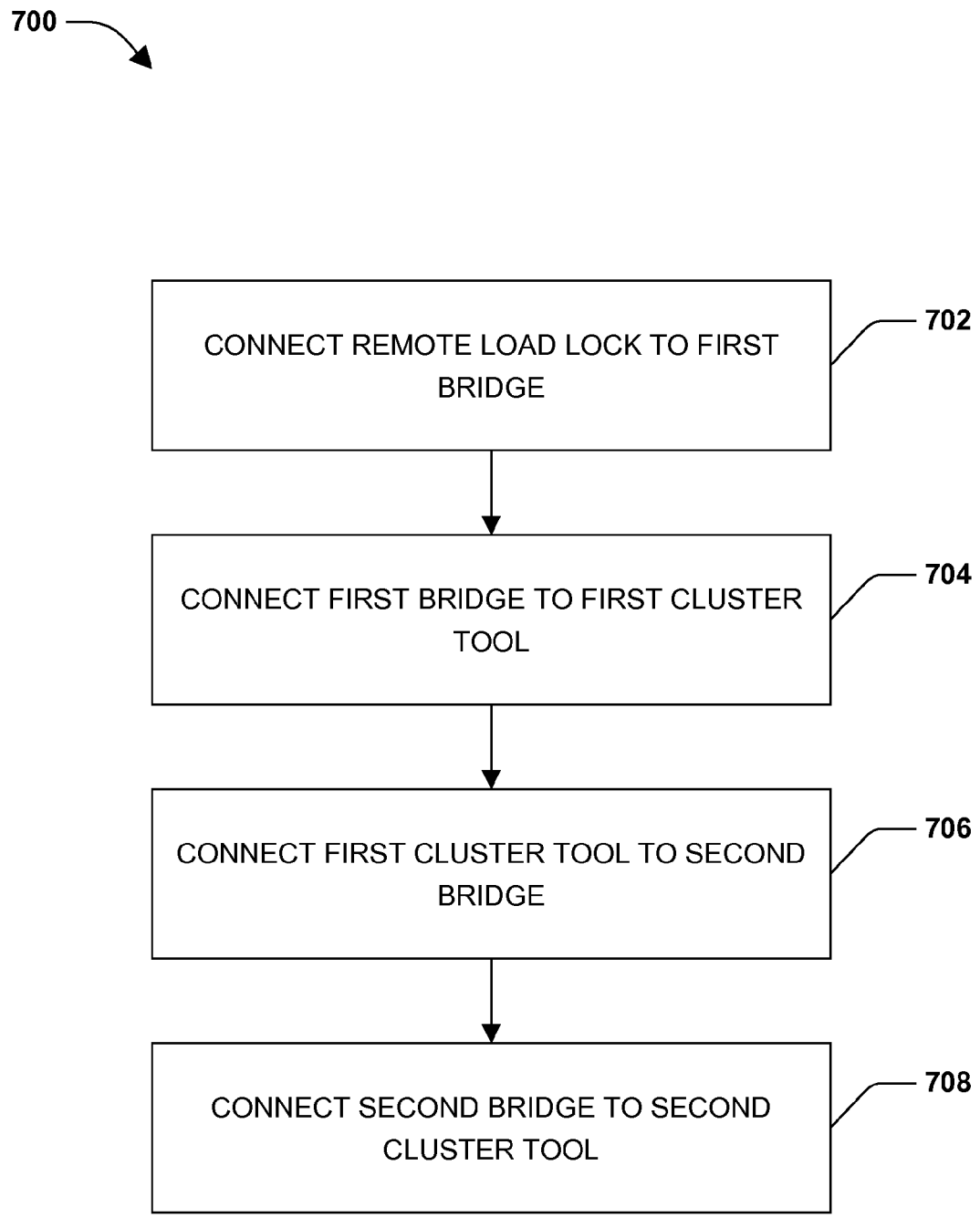
FIG. 7 is a flow diagram of an example method for ultra-high vacuum (UHV) wafer processing, according to some embodiments.

FIG. 7 is a flow diagram of an example method 700 for ultra-high vacuum (UHV) wafer processing, according to some embodiments. In some embodiments, the method 700 comprises connecting a remote load lock (RLL) module to a first bridge at 702. For example, the first bridge comprises a first buffer module located between a first bypass module and a second bypass module. At 704, the method 700 comprises connecting the first bridge to a first cluster tool. For example, first cluster tool comprises one or more transfer modules, one or more via channels, or one or more process chambers. At 706, the method 700 comprises connecting the first cluster tool to a second bridge. For example, the second bridge comprises a second buffer module located between a third bypass module and a fourth bypass module. At 708, the method 700 comprises connecting the second bridge to a second cluster tool. For example, the second cluster tool comprises one or more transfer modules, one or more via channels, or one or more process chambers. In some embodiments, the second cluster tool is connected to the first bridge via the second bypass module. In other embodiments, the second cluster tool is connected to a third bridge connected to a third cluster tool, etc. In this way, process expansion is facilitated, at least by increasing a number of cluster tools connected within an UHV environment. Accordingly, any number of cluster tools can be connected by a corresponding number of bridges, thus enabling more complex wafer fabrication associated with a large number of process chambers, for example.

According to some aspects, a vacuum system for ultra-high vacuum (UHV) wafer processing is provided, comprising a remote load lock (RLL) module. For example, the RLL module is configured to receive a wafer from a load port. For another example, the RLL module is configured to pump down the RLL module to a first pressure. In some embodiments, the vacuum system comprises a first bridge. In some embodiments, the first bridge comprises a first buffer module and a first bypass module. In some embodiments, the first buffer module is configured to receive the wafer from the RLL module. In some embodiments, the first buffer module is configured to pump down the first buffer module to a second pressure. For example, the second pressure less than the first pressure. In some embodiments, the first bypass module is configured to receive the wafer from the first buffer module.

According to some aspects, a vacuum system for ultra-high vacuum (UHV) wafer processing is provided, comprising a remote load lock (RLL) module. For example, the RLL module is configured to receive a wafer from a load port. For another example, the RLL module is configured to pump down the RLL module to a first pressure. In some embodiments, the vacuum system comprises a first bridge. For example, the first bridge is configured to connect the RLL module to a first cluster tool. In some embodiments, the first bridge comprises a first bypass module, a first buffer module, and a second bypass module. In some embodiments, the first buffer module is configured to receive the wafer from the second bypass module. In some embodiments, the first buffer module is configured to receive the wafer from the RLL module. In some embodiments, the first buffer module is configured to pump down the first buffer module to a second pressure. In some embodiments, the second pressure is less than the first pressure. In some embodiments, the first bypass module is configured to receive the wafer from the first buffer module. Additionally, in some embodiments, the first bypass module is connected to the first cluster tool. In some embodiments, the vacuum system comprises a second bridge. For example, the second bridge is configured to connect the first cluster tool to a second cluster tool. In some embodiments, the second bridge is associated with the second pressure. In some embodiments, the second bridge comprises a third bypass module, a second buffer module, and a fourth bypass module. In some embodiments, the fourth bypass module is configured to receive the wafer from the first cluster tool. In some embodiments, the second buffer module is configured to receive the wafer from the fourth bypass module. In some embodiments, the third bypass module is configured to receive the wafer from the second buffer module. Additionally, in some embodiments, the third bypass module is connected to the second cluster tool.

According to some aspects, a method for ultra-high vacuum (UHV) wafer processing is provided, comprising connecting a remote load lock (RLL) module to a first bridge. For example, the first bridge comprises a first buffer module located between a first bypass module and a second bypass module. In some embodiments, the method comprises connecting the first bridge to a first cluster tool. For example, the first cluster tool comprises one or more transfer modules, one or more via channels, and one or more process chambers. In some embodiments, the method comprises connecting the first cluster tool to a second bridge. For example, the second bridge comprises a second buffer module located between a third bypass module and a fourth bypass module. In some embodiments, the method comprises connecting the second bridge to a second cluster tool. For example, the second cluster tool comprises one or more transfer modules, one or more via channels, and one or more process chambers.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A vacuum system for ultra-high vacuum (UHV) wafer processing, comprising:
   a remote load lock (RLL) module configured to:
      receive a wafer from a load port; and
      pump down the RLL module to a first pressure;
   a first bridge configured to connect the RLL module to a first cluster tool, the first bridge comprising:
      a first buffer module configured to:
         receive the wafer from the RLL module; and
         pump down the first buffer module to a second pressure, the second pressure less than the first pressure; and
      a first bypass module configured to receive the wafer from the first buffer module; and
   a second bridge configured to connect the first cluster tool to a second cluster tool.

2. The vacuum system of claim 1, the RLL module comprising:
   one or more isolation valves configured to control media flow associated with the RLL module.

3. The vacuum system of claim 1, the first buffer module comprising:
   a robotic arm configured to at least one of:
      transfer the wafer from the RLL module to the first buffer module; or
      transfer the wafer from the first buffer module to the first bypass module; and
   one or more isolation valves configured to control media flow associated with the first buffer module.

4. The vacuum system of claim 1, the first bypass module comprising:
   an alignment unit configured to align an orientation of the wafer; and
   one or more isolation valves configured to control media flow associated with the first bypass module.

5. The vacuum system of claim 1, the first cluster tool configured to receive the wafer from the first bypass module, the first cluster tool comprising:
   one or more transfer modules;
   one or more via channels; and
   one or more process chambers.

6. The vacuum system of claim 5, a first transfer module of the one or more transfer modules configured to receive the wafer from the first bypass module, the first bypass module configured to connect the first buffer module to the first transfer module.

7. The vacuum system of claim 1, the first cluster tool comprising:
   a first region, the first cluster tool configured to pump down the first region to a third pressure, the third pressure less than the second pressure; and
   a second region, the first cluster tool configured to pump down the second region to a fourth pressure, the fourth pressure less than the third pressure.

8. The vacuum system of claim 1, the second bridge associated with the second pressure.

9. The vacuum system of claim 1, the first buffer module comprising one or more facets configured to connect the first buffer module to at least one of:
   a process chamber; or
   the first cluster tool.

10. The vacuum system of claim 1, the first buffer module configured to connect the first bypass module to the RLL module.

11. A vacuum system for ultra-high vacuum (UHV) wafer processing, comprising:
    a remote load lock (RLL) module configured to:
       receive a wafer from a load port; and
       pump down the RLL module to a first pressure;
    a first bridge configured to connect the RLL module to a first cluster tool, the first bridge comprising:
       a second bypass module;
       a first buffer module configured to at least one of:
          receive the wafer from the second bypass module;
          receive the wafer from the RLL module; or
          pump down the first buffer module to a second pressure, the second pressure less than the first pressure; and
       a first bypass module configured to receive the wafer from the first buffer module, the first bypass module connected to the first cluster tool; and
    a second bridge configured to connect the first cluster tool to a second cluster tool, the second bridge associated with the second pressure, the second bridge comprising:
       a fourth bypass module configured to receive the wafer from the first cluster tool;
       a second buffer module configured to receive the wafer from the fourth bypass module; and
       a third bypass module configured to receive the wafer from the second buffer module, the third bypass module connected to the second cluster tool.

12. The vacuum system of claim 11, the first cluster tool comprising:
    a first transfer module configured to receive the wafer from the first bypass module;
    a second transfer module;
    one or more via channels; and
    one or more process chambers.

13. The vacuum system of claim 11, at least one of the first buffer module or the second buffer module comprising one or more facets configured to connect at least one of the first buffer module or the second buffer module to at least one of:
    a process chamber; or
    an additional cluster tool.

14. The vacuum system of claim 11, the second bypass module of the first bridge configured to receive the wafer from the second cluster tool.

15. The vacuum system of claim 11, comprising:
    a third cluster tool; and
    a third bridge configured to connect the second cluster tool to the third cluster tool, the second bypass module configured to receive the wafer from the third cluster tool.

16. The vacuum system of claim 15, the third bridge comprising:
    a sixth bypass module configured to receive the wafer from the second cluster tool;
    a third buffer module configured to receive the wafer from the sixth bypass module; and a fifth bypass module configured to receive the wafer from the third buffer module, the fifth bypass module connected to the third cluster tool.

17. The vacuum system of claim 16, the third cluster tool comprising:
- a fifth transfer module configured to receive the wafer from the fifth bypass module;
- a sixth transfer module;
- one or more via channels; and
- one or more process chambers.

18. The vacuum system of claim 11, the second cluster tool configured to pump down the second cluster tool to a fourth pressure, the fourth pressure less than the second pressure.

19. The vacuum system of claim 11, the second cluster tool connected to the first bridge.

20. A method for ultra-high vacuum (UHV) wafer processing, comprising:
- connecting a remote load lock (RLL) module to a first bridge, the first bridge comprising a first buffer module between a first bypass module and a second bypass module;
- connecting the first bridge to a first cluster tool, the first cluster tool comprising:
  - a first set of one or more transfer modules;
  - a first set of one or more via channels; and
  - a first set of one or more process chambers;
- connecting the first cluster tool to a second bridge, the second bridge comprising a second buffer module between a third bypass module and a fourth bypass module; and
- connecting the second bridge to a second cluster tool, the second cluster tool comprising:
  - a second set of one or more transfer modules;
  - a second set of one or more via channels; and
  - a second set of one or more process chambers.

\* \* \* \* \*